US008703588B2

(12) United States Patent
Hampton

(10) Patent No.: US 8,703,588 B2
(45) Date of Patent: Apr. 22, 2014

(54) METHODS OF FORMING A PHASE CHANGE MATERIAL

(75) Inventor: Keith R. Hampton, Boise, ID (US)

(73) Assignee: Micron Technology, Inc., Boise, ID (US)

(*) Notice: Subject to any disclaimer, the term of this patent is extended or adjusted under 35 U.S.C. 154(b) by 260 days.

(21) Appl. No.: 13/347,919

(22) Filed: Jan. 11, 2012

(65) Prior Publication Data
US 2012/0108037 A1 May 3, 2012

Related U.S. Application Data

(60) Division of application No. 12/909,665, filed on Oct. 21, 2010, now Pat. No. 8,124,956, which is a continuation of application No. 12/204,510, filed on Sep. 4, 2008, now Pat. No. 7,834,342.

(51) Int. Cl.
*H01L 21/365* (2006.01)

(52) U.S. Cl.
USPC ........... 438/479; 438/102; 438/238; 438/382; 438/409; 438/95

(58) Field of Classification Search
USPC ............... 438/479, 102, 238, 382, 409, 95
See application file for complete search history.

(56) References Cited

U.S. PATENT DOCUMENTS

| | | | |
|---|---|---|---|
| 5,296,716 A | 3/1994 | Ovshinsky et al. | |
| 6,210,770 B1 | 4/2001 | Kikuchi et al. | |
| 6,888,155 B2 | 5/2005 | Campbell | |
| 7,321,130 B2 | 1/2008 | Lung et al. | |
| 7,371,429 B2 | 5/2008 | Lee et al. | |
| 7,834,342 B2 | 11/2010 | Hampton | |
| 7,888,165 B2 | 2/2011 | Hampton | |
| 8,124,956 B2 | 2/2012 | Hampton | |
| 2005/0169070 A1 | 8/2005 | Reinberg et al. | |
| 2006/0097240 A1 | 5/2006 | Lowrey et al. | |
| 2006/0113520 A1 | 6/2006 | Yamamoto et al. | |
| 2006/0172067 A1 | 8/2006 | Ovshinsky et al. | |

(Continued)

FOREIGN PATENT DOCUMENTS

| | | |
|---|---|---|
| JP | 2006182781 A | 7/2006 |
| JP | 2007080978 A | 3/2007 |

(Continued)

OTHER PUBLICATIONS

Ahn et al., Highly Manufacturable High Density Phase Change Memory of 64Mb and Beyond, Adv. Technol. Dev., Samsung Electron. Co., Ltd., Electron Devices Meeting, 2004, IEDM Technical Digest, Dec. 13-15, 2004, pp. 907-910.

(Continued)

*Primary Examiner* — Long Pham
(74) *Attorney, Agent, or Firm* — TraskBritt

(57) ABSTRACT

A phase change material including a high adhesion phase change material formed on a dielectric material and a low adhesion phase change material formed on the high adhesion phase change material. The high adhesion phase change material includes a greater amount of at least one of nitrogen and oxygen than the low adhesion phase change material. The phase change material is produced by forming a first chalcogenide compound material including an amount of at least one of nitrogen and oxygen on the dielectric material and forming a second chalcogenide compound including a lower percentage of at least one of nitrogen and oxygen on the first chalcogenide compound material. A phase change random access memory device, and a semiconductor structure are also disclosed.

18 Claims, 2 Drawing Sheets

(56) References Cited

U.S. PATENT DOCUMENTS

| | | |
|---|---|---|
| 2006/0172083 A1 | 8/2006 | Lee et al. |
| 2006/0209495 A1 | 9/2006 | Lee et al. |
| 2007/0095651 A1 | 5/2007 | Ye et al. |
| 2007/0099332 A1 | 5/2007 | Kardokus et al. |
| 2007/0102283 A1 | 5/2007 | Won et al. |
| 2007/0108430 A1 | 5/2007 | Lung |
| 2007/0170413 A1 | 7/2007 | Matsui et al. |
| 2007/0181867 A1 | 8/2007 | Hewak et al. |
| 2007/0246782 A1 | 10/2007 | Philipp et al. |
| 2007/0281420 A1 | 12/2007 | Lai et al. |
| 2007/0287252 A1 | 12/2007 | Allen |
| 2008/0006811 A1 | 1/2008 | Philipp et al. |
| 2008/0026574 A1 | 1/2008 | Brcka |
| 2008/0055969 A1 | 3/2008 | Liu |
| 2008/0075843 A1 | 3/2008 | Kuh et al. |
| 2008/0075844 A1 | 3/2008 | Ha et al. |
| 2008/0099326 A1 | 5/2008 | Ye et al. |
| 2008/0099791 A1 | 5/2008 | Lung |
| 2008/0102560 A1 | 5/2008 | Hamamjy et al. |
| 2008/0105862 A1 | 5/2008 | Lung et al. |
| 2008/0258128 A1 | 10/2008 | Kuh et al. |
| 2008/0280440 A1 | 11/2008 | Chang |
| 2008/0314738 A1 | 12/2008 | Gopalakrishnan et al. |
| 2008/0314739 A1 | 12/2008 | Gopalakrishnan et al. |
| 2009/0022883 A1 | 1/2009 | Ovshinsky et al. |
| 2009/0039333 A1 | 2/2009 | Chang et al. |
| 2010/0038614 A1 | 2/2010 | Hampton |
| 2010/0041907 A1 | 2/2010 | Mitzi et al. |
| 2010/0051895 A1 | 3/2010 | Hampton |
| 2010/0203709 A1 | 8/2010 | Czubatyj |
| 2010/0314601 A1 | 12/2010 | Lee |
| 2011/0049456 A1 | 3/2011 | Lung et al. |
| 2012/0170359 A1 | 7/2012 | Wu et al. |

FOREIGN PATENT DOCUMENTS

| | | |
|---|---|---|
| WO | 2007029938 A1 | 3/2007 |
| WO | 2007133837 A2 | 11/2007 |
| WO | 2008057616 A2 | 5/2008 |

OTHER PUBLICATIONS

Ding et al., A New PVD Sputtering Source for Metal Gate Application, Solid-State and Integrated Circuit Technology, 2006, ICSICT '06 8th International Conference, Oct. 2006, pp. 509-512.

Kikuchi et al., Preparation of Oxygen-Doped and Nitrogen-Doped Ge-Sb-Te System Thin Film for Phase Change Random Access Memory by RF Magnetron Sputtering, Non-Volatile Memory Technology Symposium, 2006, NVMTS 2006 7the Annual, Nov. 5-8, 2006, pp. 81-83.

Morales-Sanchez et al., Influence of Oxygen on the Crystallization Process in Ge:Sb:Te:O Films, Electrical and Electronics Engineering, 2006 3rd International Conference, Sep. 2006, pp. 1-4.

Niinisto, Advanced Thin Films for Electronics and Opto-Electronics by Atomic Layer Epitaxy, Semiconductor Conference, 2000, CAS 2000 Proceedings, Oct. 10-14, 2000, vol. 1, pp. 33-42.

Herklotz et al, Technological Advances in Physical Vapor Deposition, IEEE Transactions on Components, Hybrids, and Manufacturing Technology, vol. 6, No. 2, Jun. 1983, pp. 173-180.

METHODS OF FORMING A PHASE CHANGE MATERIAL

CROSS-REFERENCE TO RELATED APPLICATIONS

This application is a divisional of U.S. patent application Ser. No. 12/909,665, filed Oct. 21, 2010, now U.S. Pat. No. 8,124,956, issued Feb. 28, 2012, which is a continuation of U.S. patent application Ser. No. 12/204,510, filed Sep. 4, 2008, now U.S. Pat. No. 7,834,342, issued Nov. 16, 2010, the disclosure of each of which is hereby incorporated herein by this reference in its entirety.

TECHNICAL FIELD

Embodiments of the present invention relate to a phase change material having improved adhesion to a dielectric material. More specifically, the present invention, in various embodiments, relates to a phase change material including at least two portions, one portion having a higher percentage of at least one of nitrogen and oxygen than the other portion, methods of producing the phase change material, and devices incorporating the phase change material.

BACKGROUND

Phase change materials are known in the art and include compounds formed from germanium (Ge), antimony (Sb), and tellurium (Te), which are known as GST materials. The phase change material is capable of being reversibly electrically switched between an amorphous state and a crystalline state. The phase change material is electrically writable and erasable and has been used in electronic memory applications. When the phase change material is in the amorphous state, it is said to be "reset," while the phase change material is said to be "set" in the crystalline state. Phase change materials have been used in phase change random access memory (PCRAM) devices to provide non-volatile memory with long data retention. PCRAM devices rely on the electrically bistable status of resistance differences between the amorphous and crystalline states of the phase change material.

One GST material conventionally used in PCRAM devices is $Ge_2Sb_2Te_5$. However, during fabrication of the PCRAM device, the GST material exhibits a low adhesion to a dielectric material upon which the GST material is formed. The dielectric material includes silicon oxide ($SiO_x$) or silicon nitride ($SiN_x$). In other words, the GST material, as deposited on the dielectric material, tends to delaminate or peel away from the dielectric material during the fabrication process. It would be desirable to form a phase change material having improved adhesion to the dielectric material in devices utilizing phase change materials.

DETAILED DESCRIPTION

Figure 1:
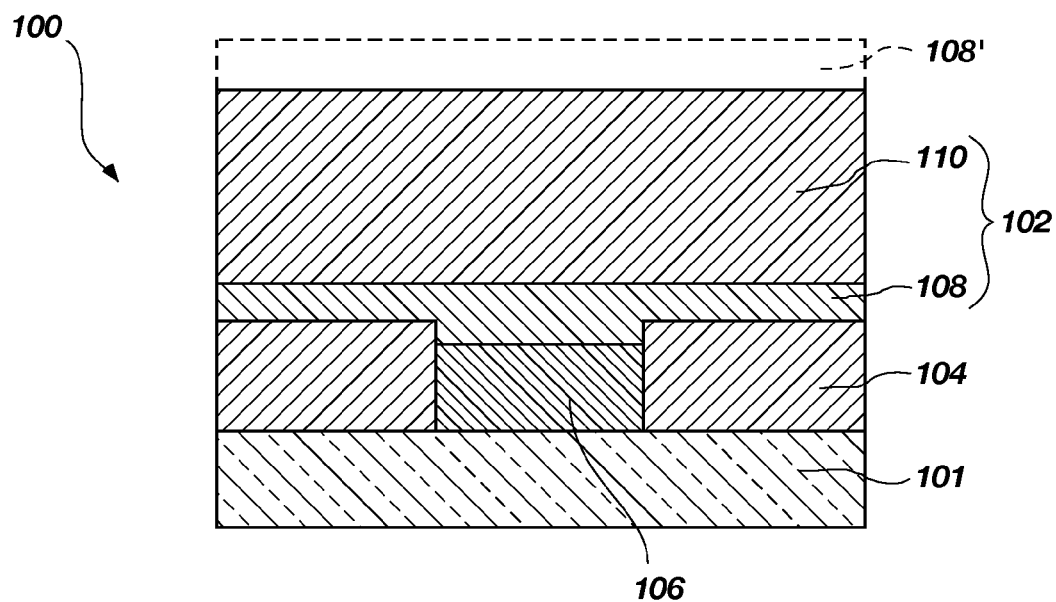
FIG. 1 is a cross-sectional view of a memory cell including a phase change material formed in accordance with an embodiment of the invention.

A phase change material having improved adhesion to a dielectric material and methods of forming such a phase change material are disclosed. As used herein, the phrase "phase change material" means and includes a chalcogenide compound formed from a chalcogen ion and at least one electropositive element. The phase change material includes at least two portions, with one of the portions having an increased content of at least one of nitrogen and oxygen relative to the other portion. Increasing the amount of nitrogen or oxygen in a first portion of the phase change material provides improved adhesion between the phase change material and the underlying dielectric material. Accordingly, a phase change material having the desired adhesion to the dielectric material is produced.

The following description provides specific details, such as material types, material thicknesses, and processing conditions in order to provide a thorough description of embodiments of the present invention. However, a person of ordinary skill in the art will understand that the embodiments of the present invention may be practiced without employing these specific details. Indeed, the embodiments of the present invention may be practiced in conjunction with conventional fabrication techniques employed in the industry. In addition, the description provided herein does not form a complete process flow for manufacturing a PCRAM device, and the PCRAM device described below does not form a complete semiconductor device. Only those process acts and structures necessary to understand the embodiments of the present invention are described in detail below. Additional acts to form a complete semiconductor device including the PCRAM device may be performed by conventional techniques.

The materials described herein may be formed by any suitable technique including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

In the following detailed description, reference is made to the accompanying drawings, which form a part hereof, and in which is shown, by way of illustration, specific embodiments in which the invention may be practiced. These embodiments are described in sufficient detail to enable a person of ordinary skill in the art to practice the invention. However, other embodiments may be utilized, and structural, logical, and electrical changes may be made without departing from the scope of the invention. The illustrations presented herein are not meant to be actual views of any particular system, phase change material, or PCRAM device, but are merely idealized representations that are employed to describe the present invention. The drawings presented herein are not necessarily drawn to scale. Additionally, elements common between drawings may retain the same numerical designation.

The chalcogen ion of the phase change material may be oxygen (O), sulfur (S), selenium (Se), Te, or polonium (Po). In one embodiment, the chalcogen ion is Te. The electropositive element may include, but is not limited to, nitrogen (N), silicon (Si), nickel (Ni), gallium (Ga), Ge, arsenic (As), silver (Ag), indium (In), tin (Sn), Sb, gold (Au), lead (Pb), bismuth (Bi), or combinations thereof. In one embodiment, the electropositive elements are Ge and Sb. The chalcogenide compound may be a binary, ternary, or quaternary alloy of these elements. By way of non-limiting example, the chalcogenide compound may be a compound of Ge, Sb, and Te (a GST material). The GST material may have an empirical formula of $Ge_xSb_{100-(x+y)}Te_y$, where the stoichiometry (in atomic percent) of Ge and Te are indicated by x and y, respectively, and the remainder of the GST material is Sb. By way of non-limiting example, x may be greater than approximately 5 atomic percent but less than approximately 60 atomic percent, such as between approximately 17 atomic percent and approximately 44 atomic percent, and y may be greater than approximately 20 atomic percent but less than approximately 70 atomic percent, such as between approximately 23 atomic percent and approximately 56 atomic percent. By way of non-limiting example, the GST material may be $Ge_{22}Sb_{22}Te_{55}$ (also known as $Ge_2Sb_2Te_5$), $Ge_8Sb_{32}Te_{56}$ (also known as $Ge_1Sb_4Te_7$), $Ge_{14}Sb_{28}Te_{56}$ (also known as $Ge_1Sb_2Te_4$), $Ge_{40}Sb_9Te_{51}$, $Ge_{44}Sb_5Te_{51}$, $Ge_{28}Sb_{27}Te_{45}$, $Ge_{58}Sb_{19}Te_{23}$, $Ge_rSb_{27}Te_{56}$, $Ge_{30}Sb_{17}Te_{53}$, or combinations thereof. While compounds having specific stoichiometries are listed above, the phase change material may include other stoichiometries of Ge, Sb, and Te.

While specific examples herein describe the phase change material as a GST material, the phase change material may be a chalcogenide compound formed from combinations of the other elements described above. By way of non-limiting example, the chalcogenide compound may be a compound of Sb and Te, such as $Sb_2Te_3$, a compound of Ge and Te, such as GeTe, a compound of In and Se, such as $In_2Se_3$, a compound of Sn and Te, such as SnTe, a compound of Bi and Te, such as $Bi_2Te_3$, a compound of Sb and Te, such as SbTe, a compound of Sn and Se, such as SnSe, a compound of Ge and Se, such as GeSe, a compound of Au, Ge, Sn, and Te, such as $Au_{25}Ge_4Sn_{11}Te_{60}$, a compound of Ag and Se, such as $Ag_2Se$, or a compound of In and Te, such as InTe. While chalcogenide compounds having specific stoichiometries are listed above, the chalcogenide compound may include the same combination of elements having other stoichiometries.

FIG. 1 is an illustration of a memory cell 100 including a phase change material 102. The memory cell 100 includes a substrate 101 upon which the phase change material 102 is formed. The phase change material 102 may include at least two portions 108, 110 thereof. The substrate 101 may include a conventional silicon substrate or other bulk substrate including a layer of semiconductor material. As used herein, the term "bulk substrate" includes not only silicon wafers, but also silicon-on-insulator (SOI) substrates, silicon-on-sapphire (SOS) substrates, epitaxial layers of silicon on a base semiconductor foundation, and other semiconductor or optoelectronics materials, such as silicon-germanium, germanium, gallium arsenide, or indium phosphide. The material of the substrate 101 may be doped or undoped. A dielectric material 104 may be formed over the surface of the substrate 101. The dielectric material 104 may be formed from a SiO or $SiN_x$ material suitable as an insulative or dielectric material, such as, for example, SiO, $SiO_2$, or $Si_3N_4$. The dielectric material 104 may be formed by conventional techniques, such as by plasma enhanced CVD (PECVD) or standard thermal CVD. The dielectric material 104 may be patterned, as known in the art, to form apertures (not shown) therein. A lower electrode 106 may be formed within the apertures of the dielectric material 104 by conventional techniques. The material used for the lower electrode 106 may be a conductive material, such as tungsten (W), nickel (Ni), tantalum nitride (TaN), platinum (Pt), tungsten nitride (WN), gold (Au), titanium nitride (TiN), or titanium aluminum nitride (TiAlN). The phase change material 102 may be formed onto upper, exposed surfaces of the lower electrode 106 and the dielectric material 104, such as by PVD.

The phase change material 102 may be sufficiently adherent to the dielectric material 104 to form an operative memory cell 100. Otherwise, the phase change material 102 may delaminate from the dielectric material 104, rendering the memory cell 100 inoperable for use in a PCRAM device. To provide increased adhesion of the phase change material 102 to the dielectric material 104, nitrogen, oxygen, or a combination thereof may be incorporated into a first portion 108 of the phase change material 102. As such, the first portion 108 of the phase change material 102 may have an increased amount of at least one of nitrogen and oxygen relative to a second portion 110 of the phase change material 102. For convenience, the remainder of the application refers to nitrogen or oxygen being present in the first portion 108 of the phase change material 102. However, it is understood that a combination of nitrogen and oxygen may also be present.

The two portions 108, 110 of the phase change material 102 may be formed over the lower electrode 106 and the dielectric material 104. The first portion 108 of phase change material 102, which is in contact with the lower electrode 106 and the dielectric material 104, may exhibit increased adhesion to the dielectric material 104 and is also referred to herein as high adhesion phase change material 108. The high adhesion phase change material 108 may be formed in direct contact with the upper surface of the dielectric material 104 and lower electrode 106. The second portion 110 of the phase change material 102 may exhibit a lower degree of adhesion to the dielectric material 104 and is referred to herein as low adhesion phase change material 110. The low adhesion phase change material 110 may be formed over and in contact with the high adhesion phase change material 108. The high adhesion phase change material 108 and low adhesion phase change material 110 are collectively referred to herein as phase change material 102.

The high adhesion phase change material 108 may include a sufficient amount of nitrogen or oxygen such that a high degree of adhesion between the high adhesion phase change material 108 and the dielectric material 104 is achieved. By forming the low adhesion phase change material 110 over the high adhesion phase change material 108 and not in direct contact with the dielectric material 104, the phase change material 102 may have sufficient adherence to the dielectric material 104 to prevent delamination. The strength of adhesion between the phase change material 102 and the dielectric material 104 may be measured by the fracture energy sufficient to cause an adhesion failure between the phase change material 102 and the dielectric material 104. The adhesion strength may be determined in a four-point bend test, as known in the art. A high strength of adhesion corresponds to a high fracture energy sufficient to cause the adhesion failure, or delamination, of the phase change material 102 from the dielectric material 104. The high adhesion phase change material 108 may provide a high adhesion strength between the phase change material 102 and the dielectric material 104. In one embodiment, the fracture energy between the phase change material 102 and the dielectric material 104 may be at least about 0.94 $J/m^2$, such as at least about 1.5 $J/m^2$. In another embodiment, the fracture energy between the phase change material 102 and the dielectric material 104 may be at least about 2.0 $J/m^2$.

In order to achieve a high adhesion strength, the high adhesion phase change material 108 may include greater than or equal to about 5% (atomic) of nitrogen, oxygen, or a combination thereof. While increasing the amount of nitrogen or oxygen in the high adhesion phase change material 108 may increase the degree of adhesion between the high adhesion phase change material 108 and the dielectric material 104, if the same amount of nitrogen or oxygen is present in the entire phase change material 102, the ability of the phase change material 102 to crystallize may be affected. Stated another way, if the phase change material 102 includes too much nitrogen or oxygen, the phase change material 102 may be unable to crystallize, which affects the ability of the phase change material 102 to electrically switch between the amorphous and crystalline states. As such, if the phase change material 102 includes too high of an amount of nitrogen or oxygen, the phase change material 102 may not be suitable for use in a PCRAM device. To enable the phase change material 102 to crystallize, the increased nitrogen or oxygen content is present in the high adhesion phase change material 108 while the low adhesion phase change material 110 includes less or no nitrogen or oxygen. Since only a portion of the phase change material 102 includes a greater amount of nitrogen or oxygen, the phase change material 102 may still be capable of electrically switching. Even if the high adhesion phase change material 108 includes greater than about 10% (atomic) of nitrogen or oxygen, such as from about 10% (atomic) to about 20% (atomic) of nitrogen or oxygen, the phase change material 102 may be capable of electrically switching. In one embodiment, to enable the phase change material 102 to crystallize, the high adhesion phase change material 108 may include less than or equal to about 8% (atomic) of nitrogen or oxygen. As such, to provide the desired adhesion, the high adhesion phase change material 108 may include from greater than or equal to about 5% (atomic) to less than or equal to about 8% (atomic) of nitrogen or oxygen. In another embodiment, the high adhesion phase change material 108 may include from about 6% (atomic) to about 7% (atomic) of nitrogen or oxygen.

The memory cell 100 may, optionally, include a high adhesion phase change material 108' formed over the low adhesion phase change material 110, as illustrated in FIG. 1 with dashed lines. The high adhesion phase change material 108' may provide increased adhesion between an upper electrode 120 (see FIG. 2) and the phase change material 102.

Relative to the high adhesion phase change material 108, the low adhesion phase change material 110 may include a decreased amount of nitrogen, oxygen, or a combination thereof. The decreased amount of nitrogen or oxygen in the low adhesion phase change material 110 may ensure the phase change material 102 is capable of crystallizing, enabling adequate use thereof in a PCRAM device. By way of example only, the low adhesion phase change material 110 may include from about 0% (atomic) to less than about 5% (atomic) of nitrogen or oxygen, such as less than about 4% (atomic) of nitrogen or oxygen. In one embodiment, the low adhesion phase change material 110 may include about 2.5% (atomic) of nitrogen or oxygen.

The thickness of the high adhesion phase change material 108 and the low adhesion phase change material 110 may depend on the size and shape of the memory cell 100 ultimately to be formed in the PCRAM device. Since the only portion of the phase change material 102 in contact with the dielectric material 104 is the high adhesion phase change material 108, improved adhesion between the dielectric material 104 and the phase change material 102 may be achieved by providing a thin layer of the high adhesion phase change material 108 between the dielectric material 104 and the low adhesion phase change material 110. For example, the high adhesion phase change material 108 may have a thickness ranging from about 10 Å to about 100 Å. The remainder of the phase change material 102 may include the low adhesion phase change material 110. By way of non-limiting example, if the phase change material 102 is formed at a total thickness of about 1000 Å, the high adhesion phase change material 108 may account for about 50 Å of the phase change material 102 and the low adhesion phase change material 110 may account for about 950 Å of the phase change material 102.

Since the phase change material 102 includes two portions 108, 110, the phase change material 102 may have a substantially heterogeneous composition throughout its thickness. For example, the high adhesion phase change material 108 and low adhesion phase change material 110 may be chalcogenide materials differing in their respective atomic percentages of nitrogen or oxygen. The distinct materials or portions of the phase change material 102 may be distinguishable by visual or chemical means, such as by microscopy or chemical analysis. By way of non-limiting example, if the phase change material 102 were viewed by transmission electron microscopy, the high adhesion phase change material 108 and low adhesion phase change material 110 may be visually distinguishable from one another. In addition, chemical analysis, such as X-ray photoelectron spectroscopy (XPS) or inductively coupled plasma (ICP) spectrometry, may be used to distinguish the two portions of the phase change material 102.

Figure 2:
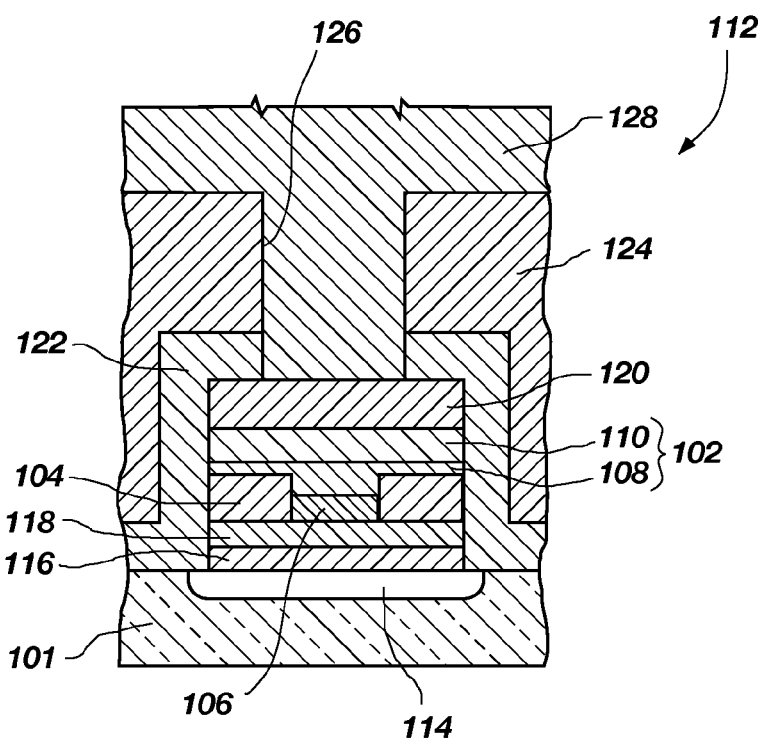
FIG. 2 is a cross-sectional view illustrating the fabrication of a PCRAM device in accordance with an embodiment of the invention.

The phase change material 102 may be used in a PCRAM device 112, as illustrated in FIG. 2. While specific examples herein describe and illustrate the phase change material 102 in a PCRAM device 112, the phase change material 102 may also be used in a complementary metal-oxide semiconductor (CMOS) device or in an optical disc, such as a DVD/RW. The PCRAM device 112 includes a memory matrix or array (not shown) that includes a plurality of memory cells 100 for storing data. The memory matrix is coupled to periphery circuitry (not shown) by a plurality of control lines. The periphery circuitry may include circuitry for addressing the memory cells 100 contained within the memory matrix, along with circuitry for storing data in and retrieving data from the memory cells 100. The periphery circuitry may also include other circuitry used for controlling or otherwise ensuring the proper functioning of the PCRAM device 112.

As shown in FIG. 2, the PCRAM device 112 includes substrate 101, digit line 114, n-doped polysilicon material 116, p-doped polysilicon material 118, dielectric material 104, lower electrode 106, phase change material 102 (high adhesion phase change material 108 and low adhesion phase change material 110), upper electrode 120, insulative material 122, oxide material 124, and contact hole 126 filled with conductive material 128. The PCRAM device 112 may be formed by conventional techniques, which are not described in detail herein. The PCRAM device 112 may, optionally, include the high adhesion phase change material 108' (not illustrated in FIG. 2) formed between the low adhesion phase change material 110 and the upper electrode 120. The high adhesion phase change material 108' may provide increased adhesion between the upper electrode 120 and the phase change material 102.

To form the two portions of the phase change material 102 (the high adhesion phase change material 108 and low adhesion phase change material 110) on the dielectric material 104, the phase change material 102 may be formed by a deposition technique in which a plasma is capable of being formed and in the presence of nitrogen gas, oxygen gas, or a combination thereof. The nitrogen gas or oxygen gas may be present in a deposition chamber as the high adhesion phase change material 108 is formed but may be absent as the low adhesion phase change material 110 is formed. By way of non-limiting example, the deposition technique may be a PVD technique or a CVD technique. PVD includes, but is not limited to, sputtering, evaporation, or ionized PVD. Such deposition techniques are known in the art and, therefore, are not described in detail herein.

Figure 3:
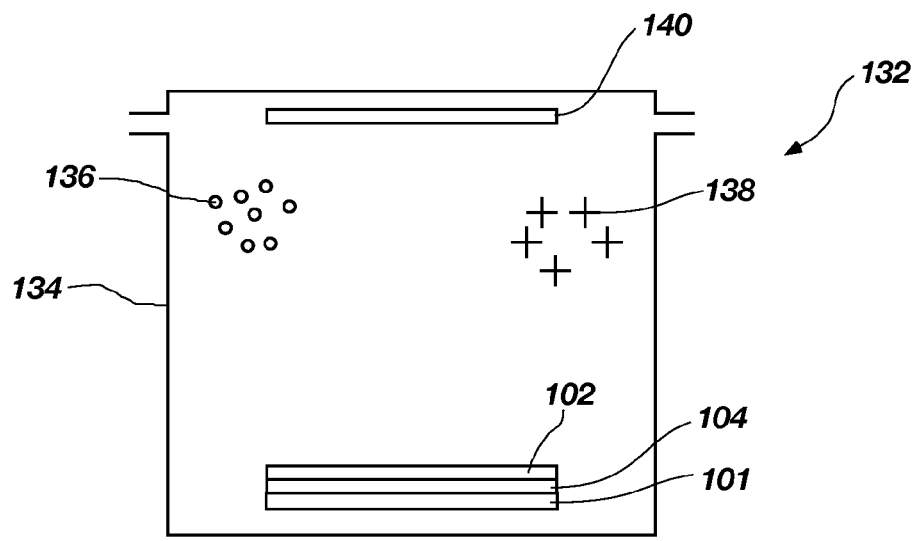
FIG. 3 is a deposition system in accordance with an embodiment of the invention.

A system 132 for forming the phase change material 102 on the dielectric material 104 is illustrated in FIG. 3. The substrate 101 including the dielectric material 104 may be positioned or placed on a support or chuck (not shown) of a deposition chamber 134 in which a plasma 136 is capable of being produced. The deposition chamber 134 may also be configured to introduce nitrogen gas or oxygen gas 138 therein. By adjusting the flow rate of nitrogen gas or oxygen gas 138 into the deposition chamber 134, the high adhesion phase change material 108 and the low adhesion phase change material 110 may be formed. The plasma 136 produced in the deposition chamber 134 may be an inert plasma produced from a noble gas element, such as a helium, neon, argon, krypton, xenon, or radon. In one embodiment, an argon plasma is generated. The nitrogen gas or oxygen gas 138 may be introduced into the deposition chamber 134 at a flow rate of from about 0 standard cubic centimeters per minute (sccm) to about 5 sccm. By way of non-limiting example, the deposition chamber 134 may be a conventional PVD chamber or PVD tool. Since conventional PVD chambers are capable of producing the plasma 136 and of introducing nitrogen gas or oxygen gas 138, a conventional PVD chamber may be used in the present invention without modification thereto. In one embodiment, the deposition chamber 134 is an Entron system, such as an Entron EX300 RF sputtering chamber, which is commercially available from Ulvac Technologies, Inc. (Methuen, Mass.).

The deposition chamber 134 may also include a deposition target 140 formed from a chalcogenide material having the same, or substantially similar, combination and stoichiometry of elements as those of the phase change material 102 to be formed. The deposition target 140 may be selected by a person of ordinary skill in the art depending on the phase change material 102 to be formed. By way of non-limiting example, the deposition target 140 may be a $Ge_2Sb_2Te_5$ target, known as a 225 target, or a $Ge_1Sb_4Te_7$ target, known as a 147 target. Such deposition targets 140 are commercially available, such as from Nikko Metals USA, Inc. (formerly known as Nikko Materials USA, Inc., Chandler, Ariz.), MMC Technology, Inc. (San Jose, Calif.), and Umicore Group (Brussels, Belgium). In one embodiment, the deposition target 140 is a 225 target.

After positioning the substrate 101 having the dielectric material 104 on the chuck, the high adhesion phase change material 108 may be formed on the dielectric material 104. The plasma 136 may be generated in the deposition chamber 134 and the nitrogen gas or oxygen gas 138 may be introduced into the deposition chamber 134. Conditions, such as temperature and pressure, for generating and maintaining the plasma 136 in the deposition chamber 134 may be conventional and, therefore, are not described in detail herein. The flow rate of the nitrogen gas or oxygen gas 138 during formation of the high adhesion phase change material 108 may range from greater than about 1 sccm to about 5 sccm. As the deposition target 140 is bombarded with the plasma 136, atoms of the deposition target 140 are sputtered from the target surface and deposited on the surface of the dielectric material 104. Nitrogen from the nitrogen gas or oxygen from the oxygen gas may covalently bond to the deposited atoms, forming a coating of the high adhesion phase change material 108 on the surface of the dielectric material 104. The nitrogen or oxygen content of the high adhesion phase change material 108 may depend on the flow rate of the nitrogen or oxygen gas 138. The greater the flow rate of the nitrogen or oxygen gas 138 into the deposition chamber 134, the greater the percentage of nitrogen or oxygen incorporated into the high adhesion phase change material 108. A desired thickness of the high adhesion phase change material 108 may be achieved, as known in the art, by controlling the deposition time and the power supplied to the deposition target. After the desired thickness of the high adhesion phase change material 108 is produced, the flow rate of the nitrogen gas or oxygen gas 138 may be reduced to less than about 1 sccm to form the low adhesion phase change material 110. Since the nitrogen or oxygen introduced into the deposition chamber 134 during the formation of the low adhesion phase change material 110 is substantially less, the low adhesion phase change material 110 may include a low amount of nitrogen or oxygen or may be substantially free of nitrogen or oxygen. In one embodiment, the flow rate of nitrogen gas or oxygen gas 138 may initially be about 5 sccm, forming a thin layer of the high adhesion phase change material 108 on the surface of the dielectric material 104. The high adhesion phase change material 108 may have a thickness of from about 10 Å to about 100 Å. The flow rate of the nitrogen gas or oxygen gas 138 may then be reduced to about 1 sccm, forming the low adhesion phase change material 110 over the high adhesion phase change material 108. The low adhesion phase change material 110 may be deposited until the phase change material 102 reaches the desired thickness, such as for example, 1000 Å.

The two portions of the phase change material 102 may be formed in a single deposition chamber 134 by adjusting the flow rate of the nitrogen gas or oxygen gas 138 during deposition thereof. By forming both the high adhesion phase change material 108 and the low adhesion phase change material 110 in situ, the phase change material 102 may be produced using a single deposition act. As such, the phase change material 102 may be produced in a cost-effective manner. In addition, the throughput for forming the phase change material 102 on the dielectric material 104 may be increased because the substrate 101 upon which the two portions of the phase change material 102 are formed does not need to be transferred between tools.

The two portions of the phase change material 102 may also be formed using a conventional nitrogen or oxygen ion implantation. The phase change material 102 may be formed by PVD or CVD. Nitrogen or oxygen may then be implanted into a portion of the phase change material 102, producing the high adhesion phase change material 108 and low adhesion phase change material 110. Alternatively, a thin layer of the low adhesion phase change material 110 may be formed on the dielectric material 104 by PVD. The substrate 101 may then be removed from the deposition chamber 134 and the low adhesion phase change material 110 may be implanted with nitrogen or oxygen ions to form the high adhesion phase change material 108. The substrate 101 may then be placed back into the deposition chamber 134 to form the low adhesion phase change material 110 by PVD over the high adhesion phase change material 108. Utilizing ion implantation may provide improved control of the distribution of the nitrogen or oxygen atoms throughout the phase change material 102. By way of non-limiting example, a high atomic percentage of nitrogen or oxygen may be achieved at the interface between the dielectric material 104 and the high adhesion phase change material 108, providing increased adhesion between the dielectric material 104 and the phase change material 102.

The phase change material 102 on the dielectric material 104 may be formed in an amorphous state or in a crystalline state by adjusting the chuck temperature. If the chuck temperature is maintained at approximately room temperature during the deposition of the phase change material 102, the phase change material 102 may be deposited in an amorphous state. At a deposition temperature above room temperature, the phase change material 102 may be deposited in a crystalline state. By way of non-limiting example, the phase change material 102 is deposited in a crystalline state. Alternatively, a portion of the phase change material 102 may be deposited in the amorphous state and another portion of the phase change material 102 may be deposited in the crystalline state.

If the phase change material 102 is a GST material, the GST material may be deposited in a crystalline state by maintaining the temperature in the deposition chamber 134 at above room temperature. In one embodiment, the as-deposited phase change material 102 is a crystalline GST material since the resistance of the crystalline GST material is on the order of kiloOhms (kΩ), while the resistance of the amorphous GST material is on the order of megaOhms (MΩ).

The following examples serve to explain embodiments of the present invention in more detail. These examples are not to be construed as being exhaustive or exclusive as to the scope of this invention.

EXAMPLES

Example 1

A GST material was deposited by PVD on a silicon nitride substrate. The GST material was deposited by PVD using a $Ge_2Sb_2Te_5$ deposition target and an argon plasma generated in an Entron EX300 RF sputtering chamber. During the deposition, the PVD chamber was maintained at 6.6 mTorr and at room temperature, and 1 KW RF power was applied to the $Ge_2Sb_2Te_5$ deposition target for 66.1 seconds. The argon flow rate was 200 sccm and the nitrogen flow rate was 5 sccm during the deposition. The resulting GST material had a thickness of 1000 Å and included 7.0% (atomic)+/−1.5% (atomic) nitrogen.

The GST-covered silicon nitride substrate was then subjected to a four-point bend test to measure the fracture energy sufficient to cause adhesion failure between the GST material and the silicon nitride substrate. The GST-covered silicon nitride substrate was positioned between two silicon wafers and bonded face to face using an epoxy. Two forces were applied to a top surface of the sandwiched structure, near outer portions of the sandwiched structure, while two forces were applied to an inner portion of the opposing surface of the sandwiched structure. The fracture energy was measured as the energy per unit area required to separate the GST material from the silicon nitride substrate. As the bending moment increased, a pre-crack initiated from the top surface (facilitated by a machined notch) and propagated vertically to the interface. The debond strain energy release rate, $G_c$, was calculated by the following equation:

$$G_c = \frac{21(1-v^2)P_c^2L^2}{16Eb^2h^3},$$

where v is Poission's ratio for the substrate, L is the distance between the inner and outer forces, E is the Young's modulus of the substrate, b is the width of the sandwiched structure, h is one half of the thickness of the sandwiched structure, and $P_c$ is the plateau load (critical load). $P_c$ is determined by graphing the load, P, versus the displacement. $P_c$ corresponds to the horizontal plateau in the load-displacement curve during the four-point bend test. The $P_c$ is the load at which the load plateaus while the displacement continues to increase. The fracture energy for the GST-covered silicon nitride substrate was $1.52 \text{ J/m}^2 +/- 0.12 \text{ J/m}^2$.

For comparative purposes, a GST material was deposited as described above except the nitrogen flow rate was maintained at 1 sccm during the deposition. The resulting GST-covered silicon nitride substrate material included 2.5% (atomic)+/−1.5% (atomic) nitrogen. The fracture energy for this GST-covered silicon nitride substrate was $0.74 \text{ J/m}^2 +/- 0.08 \text{ J/m}^2$. Since the GST-covered silicon nitride substrate formed at a nitrogen flow rate of 5 sccm had a higher nitrogen content and fracture energy than the GST-covered silicon nitride substrate formed at a nitrogen flow rate of 1 sccm, the former exhibited improved adhesion to silicon nitride.

Example 2

A first portion of a GST material was formed on a silicon nitride substrate by PVD. The GST material was deposited by PVD using a $Ge_2Sb_2Te_5$ deposition target and an argon plasma generated in an Entron EX300 RF sputtering chamber. During the deposition, the PVD chamber was maintained at 6.6 mTorr and at room temperature, and 1 KW RF power was applied to the $Ge_2Sb_2Te_5$ deposition target for 66.1 seconds. The argon flow rate was 200 sccm and the nitrogen flow rate was 5 sccm during the deposition. The nitrogen flow rate was maintained at 5 sccm until the first portion of the GST material was 50 Å thick. Then, the nitrogen flow rate was decreased to 1 sccm to form the second portion of the GST material. The deposition of the second portion was conducted until the total thickness of the GST material was 1000 Å. The resulting GST-covered silicon nitride substrate included about 50 Å of a GST material including 7.0% (atomic)+/−1.5% (atomic) of nitrogen, and about 950 Å of a GST material including 2.5% (atomic)+/−1.5% (atomic) of nitrogen. The fracture energy for the GST material and the silicon nitrate substrate was $0.94 \text{ J/m}^2 +/- 0.08 \text{ J/m}^2$.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention encompasses all modifications, variations and alternatives falling within the scope of the invention as defined by the following appended claims and their legal equivalents.

What is claimed is:

1. A method of forming a phase change material, comprising:
   introducing at least one of nitrogen gas and oxygen gas to a plasma comprising atoms of a chalcogenide material;
   contacting a substrate comprising a dielectric material with the plasma; and
   forming a first phase change material on the dielectric material and a second phase change material on the first phase change material, the first phase change material comprising a greater amount of at least one of nitrogen and oxygen than the second phase change material.

2. The method of claim 1, wherein introducing at least one of nitrogen gas and oxygen gas to a plasma comprising atoms of a chalcogenide material comprises introducing the at least one of nitrogen gas and oxygen gas at a flow rate of from 0 sccm to at least 5 sccm.

3. The method of claim 1, wherein forming a first phase change material on the dielectric material comprises introducing from greater than about 1 sccm to about 5 sccm of the at least one of nitrogen gas and oxygen gas.

4. The method of claim 1, wherein forming a second phase change material on the first phase change material comprises introducing at least one of nitrogen gas and oxygen gas at a flow rate of less than about 1 sccm.

5. The method of claim 1, wherein forming a first phase change material on the dielectric material and a second phase change material on the first phase change material comprises forming the first phase change material and the second phase change material in situ.

6. A method of forming a phase change material, comprising:
    introducing at least one of nitrogen gas and oxygen gas to a plasma comprising atoms of a chalcogenide material;
    contacting a substrate comprising a dielectric material with the plasma;
    forming a first phase change material on the substrate comprising a dielectric material;
    implanting at least one of nitrogen and oxygen into the first phase change material; and
    forming a second phase change material on the first phase change material.

7. The method of claim 6, further comprising introducing at least one of nitrogen and oxygen into the second phase change material so that there is a lower amount of the at least one of nitrogen and oxygen in the second phase change material than in the first phase change material.

8. The method of claim 6, wherein implanting at least one of nitrogen and oxygen into the first phase change material comprises forming an interface comprising at least one of nitrogen and oxygen between the dielectric material and the first phase change material.

9. The method of claim 1, wherein forming a first phase change material on the dielectric material and a second phase change material on the first phase change material comprises forming chalcogenide materials differing in at least one of nitrogen content and oxygen content.

10. The method of claim 1, wherein forming a first phase change material on the dielectric material and a second phase change material on the first phase change material comprises forming the first phase change material at a thickness of from approximately 10 Å to approximately 100 Å and the second phase change material at a thickness of from approximately 900 Å to approximately 990 Å.

11. A method of forming a phase change material, comprising:
    forming a first portion of a phase change material on a dielectric material, the first portion comprising a chalcogenide material and at least one of nitrogen and oxygen; and
    forming a second portion of the phase change material on the first portion of the phase change material, the second portion of the phase change material comprising the chalcogenide material and a decreased amount of at least one of nitrogen and oxygen than the first portion of the phase change material.

12. The method of claim 11, wherein forming a first portion of a phase change material on a dielectric material comprises forming the first portion of the phase change material comprising greater than or equal to about 5% (atomic) of at least one of nitrogen and oxygen.

13. The method of claim 11, wherein forming a first portion of a phase change material on a dielectric material comprises forming the first portion of the phase change material comprising from about 10% (atomic) to about 20% (atomic) of at least one of nitrogen and oxygen.

14. The method of claim 11, wherein forming a first portion of a phase change material on a dielectric material and forming a second portion of the phase change material on the first portion of the phase change material comprises forming a heterogeneous phase change material comprising the first portion of the phase change material and the second portion of the phase change material.

15. The method of claim 11, wherein forming a first portion of a phase change material on a dielectric material comprises forming the first portion of the phase change material in contact with the dielectric material.

16. The method of claim 11, wherein forming a second portion of the phase change material on the first portion of the phase change material comprises forming the second portion of the phase change material in contact with the first portion of the phase change material.

17. The method of claim 11, wherein forming a first portion of a phase change material on a dielectric material comprises forming the first portion of the phase change material by physical vapor deposition or chemical vapor deposition.

18. The method of claim 17, further comprising introducing the at least one of nitrogen and oxygen to the first portion of the phase change material.

* * * * *